United States Patent [19]
Mahawili

[11] Patent Number: 6,007,635
[45] Date of Patent: Dec. 28, 1999

[54] PLATFORM FOR SUPPORTING A SEMICONDUCTOR SUBSTRATE AND METHOD OF SUPPORTING A SUBSTRATE DURING RAPID HIGH TEMPERATURE PROCESSING

[75] Inventor: Imad Mahawili, Grand Rapids, Mich.

[73] Assignee: Micro C Technologies, Inc., Kentwood, Mich.

[21] Appl. No.: 08/979,604

[22] Filed: Nov. 26, 1997

[51] Int. Cl.$^6$ ................................................... C23L 16/00
[52] U.S. Cl. ............................ 118/728; 118/500; 156/345
[58] Field of Search ............................ 156/345; 118/500, 118/728

[56] References Cited

U.S. PATENT DOCUMENTS

| | | | |
|---|---|---|---|
| 4,550,684 | 11/1985 | Mahawili | 118/724 |
| 4,680,447 | 7/1987 | Mahawili | 219/343 |
| 4,993,358 | 2/1991 | Mahawili | 118/715 |
| 5,155,336 | 10/1992 | Gronet et al. | 219/411 |
| 5,310,260 | 5/1994 | Schietinger et al. | 374/142 |
| 5,317,492 | 5/1994 | Gronet et al. | 362/294 |
| 5,366,002 | 11/1994 | Tepman | 165/1 |
| 5,487,127 | 1/1996 | Gronet et al. | 392/416 |
| 5,490,728 | 2/1996 | Schietinger et al. | 374/128 |
| 5,531,835 | 7/1996 | Fodor et al. | 118/728 |
| 5,566,744 | 10/1996 | Tepman | 165/80.1 |
| 5,673,167 | 9/1997 | Davenport et al. | 361/234 |

*Primary Examiner*—Bruce Breneman
*Assistant Examiner*—Alan Olsen
*Attorney, Agent, or Firm*—Van, Dyke, Gardner, Linn & Burkhart, LLP

[57] ABSTRACT

A platform for processing a substrate in a processing chamber of a reactor includes an annular body with a recessed, generally planar substrate support surface for supporting the substrate during processing. The platform includes at least one coupler for releasably securing the platform to a platform support surface positioned inside the processing chamber. The platform is releasably secured to the platform support surface in the processing in a manner which permits unrestrained relative thermal expansion of the platform. The substrate support surface is sized to permit unrestrained radial thermal expansion of the substrate and, preferably, recessed to support the device side of the substrate substantially flush with an upper surface of the platform. The platform is suitable for use in a processing reactor which includes a heater housing and an outer reactor housing. The heater housing encloses a heater assembly and provides the support surface for supporting the platform during processing. The reactor also includes at least one gas injector for injecting at least one processing gas into the processing chamber for deposition on the substrate.

24 Claims, 5 Drawing Sheets

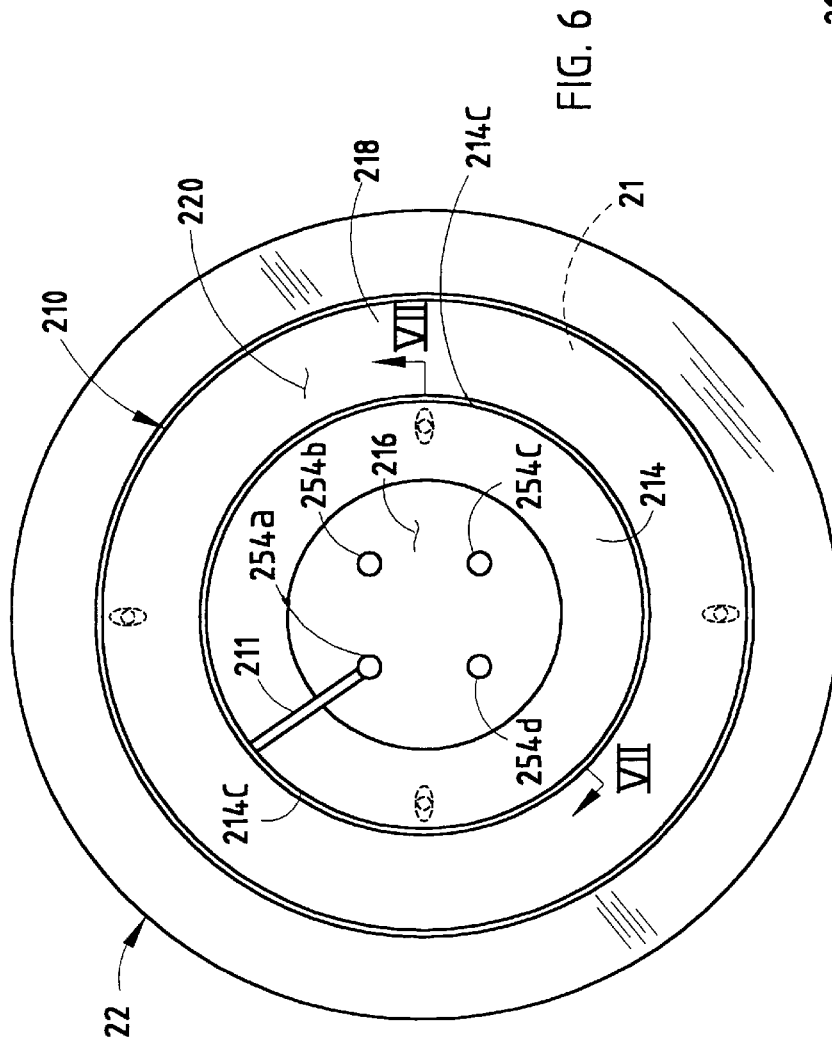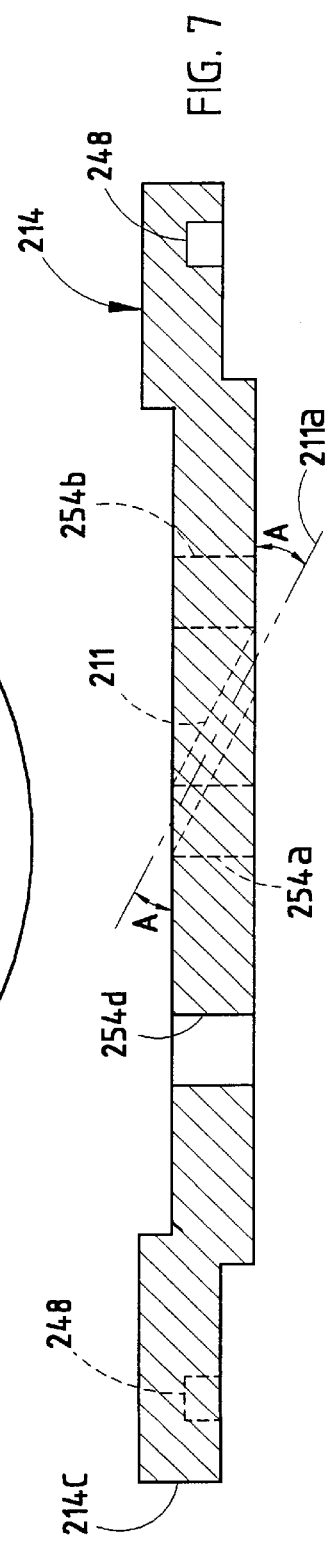

PLATFORM FOR SUPPORTING A SEMICONDUCTOR SUBSTRATE AND METHOD OF SUPPORTING A SUBSTRATE DURING RAPID HIGH TEMPERATURE PROCESSING

BACKGROUND AND TECHNICAL FIELD OF THE INVENTION

This is a continuation-in-part of patent application Ser. No. 08/912,242 entitled A SUBSTRATE PLATFORM FOR A SEMICONDUCTOR SUBSTRATE DURING RAPID HIGH TEMPERATURE PROCESSING AND METHOD OF SUPPORTING A SUBSTRATE filed on Aug. 15, 1997.

The present invention relates to a platform for a processing chamber and, more particularly, to a platform for supporting semiconductor substrates during thermal processing and chemical deposition of thin film applications, for example, during film deposition, oxide growth, etching, and thermal annealing.

When heating a substrate, it is desirable to heat the substrate rapidly and in a uniform manner so that all the regions of the substrate are heated to the same temperature. Rapid heating of the substrate reduces processing time and, therefore, increases the processing rate for a given substrate. Ultimately, with increased processing rates the cost of processing a semiconductor substrate is reduced. Furthermore, when processing semiconductor substrates it is desirable to limit impingement of the processing gases, which form the thin film depositions on the substrate, on to a single side—the device side—of the substrate.

Conventional platforms typically support the semiconductor substrate by the peripheral portion of the semiconductor substrate. In this manner, both the top and bottom surfaces of the substrate are exposed, which permits rapid heating of the substrate. However, with these configurations, the non-device side of this semiconductor substrate is not isolated from the process gases, which may result in undesirable depositions being formed on the non-device side of the substrate.

In U.S. Pat. No. 5,487,127, to Gronnet et al., the semiconductor substrate is supported at its peripheral edge by an annular support and is heated by plurality of light pipes which are positioned on one side of the substrate and treated by process gases by a shower- head-like gas injection system which is positioned on the other side of the substrate. However, with the increase in the size of wafers, this sort of arrangement may result in warpage of the semiconductor substrate since it is supported only at its peripheral edge.

In U.S. Pat. No. 4,834,022, to Mahawili, a chemical vapor deposition reactor is disclosed which includes a heater platform which provides uniform support to the wafer. The platform includes a recessed circular well for holding the semiconductor wafer therein. While the size of the platform can be increased to accommodate larger substrates, as the dimensions of the platform increase, the thickness necessarily increases in order to provide sufficient structural capacity. However, as the thickness of the platform increases the heat transfer rate reduces. Hence, the rapid processing of the semiconductor substrates may be impaired because of the reduced heat transfer rates.

Consequently, there is a need for a platform which can support a semiconductor substrate during thermal processing in a manner to limit depositions of processing gases to a single side—the device side—of the substrate and permit rapid heating of the substrate. Furthermore, there is a need for a platform which has sufficient structural integrity to support large semiconductor substrates, on the order of up to 300 mm or greater, without impeding the heat transfer from the heater source to the substrate.

SUMMARY OF THE INVENTION

As will be understood, the platform of the present invention provides numerous advantages over prior known platforms. The platform provides a support for a semiconductor substrate during thermal processing which permits the non-device side of the substrate to be isolated from the processing chamber in a conventional processing reactor. At the same time, the platform permits the heat transfer from the heater assembly of the reactor to the substrate to be maximized and, yet, provides a platform which can support semiconductor substrates on the order of 300 mm in diameter or greater. The platform further provides for at least one stacking member which is unrestrained from thermal radial expansion during the thermal processing of the semiconductor substrate. Moreover, the platform of the present invention may include a non-device side shower head injection system for cooling or heating the substrate.

In one form, a platform for supporting a semiconductor substrate during processing in a processing chamber includes a first member and a second member. The first member defines a first support surface which is adapted to support the substrate thereon. The second member includes a second support surface and a third support surface. The first member is supported by the second support surface of the second member, and the third support surface of the second member is adapted to be supported in the processing chamber.

In one aspect, the first member is rotatably coupled to the second member. In this manner, when the semiconductor substrate is processed in a processing chamber with a rotating platform, the first and second members rotate in unison.

In another aspect, the first member comprises a disc member with a recessed surface defining the first support surface. The disc member includes an annular surface which extends around the recessed surface. Preferably, the first support surface is adapted to support the substrate so that the upper surface of the substrate is substantially flush with the annular surface of the disc member.

In other aspects, one member includes at least one positioning pin and the other member includes a positioning pin receiving structure for releasably rotatably coupling the first member and the second member together. The positioning pin receiving structure preferably comprises a slotted aperture, which permits unrestrained relative radial thermal expansion of the first and second members during the thermal processing of the substrate.

In one aspect, the first support surface of the first member comprises a foraminous surface, which is adapted to permit the flow of gases through the first support surface for heating or cooling of the substrate.

In yet another aspect, the first member includes a slot, which extends transversely through at least a portion of the first member, whereby the first member exhibits reduced hoop stresses during the thermal processing of the substrate. Preferably, the slot comprises a radial transverse slot which extends from a central portion of the first support surface to a free edge of the first member.

In another form of the invention, a reactor for processing a substrate includes a first housing defining a processing chamber and a second housing which is rotatably supported in the first housing. The substrate is supported on the second housing by a platform. The platform includes a first member defining a first support surface adapted to support the substrate thereon and a second member, which includes a second support surface and a third support surface. The first member is supported by the second support surface of the second member. The third support surface of the second member is supported by the second housing. The reactor further includes a heater, which is adapted to heat the substrate, and is supported by the first housing and enclosed in the second housing. At least one gas injector is provided which injects at least one gas into the processing chamber for deposition onto the substrate.

In yet another form of the invention, a method of supporting a semiconductor substrate during processing includes supporting a substrate on a first member and supporting the first member on a second member. The second member is supported in a processing chamber. The processing chamber, the first member, and the second member are adapted to permit unrestrained radial thermal expansion of the substrate, the first member, and the second member during thermal processing of the substrate.

In still yet another form of the invention, a platform for supporting a semiconductor substrate during processing includes a central opening, a first side with a generally planar recessed surface and a second side configured for being supported by a rotatable housing in a processing chamber. The recessed surface is configured to support the substrate thereon and to permit unrestrained thermal expansion of the substrate. In a similar manner, the annular member is configured to be supported in the processing chamber in a radially unrestrained manner to permit radial thermal expansion of the platform. The platform further includes a coupler, which is positioned on the second side of the platform for rotatably coupling the annular member to the rotatable housing and is configured to permit unrestrained thermal expansion of the platform during thermal processing.

These and other objects, advantages, purposes and features of the invention will be apparent to one skilled in the art from a study of the following description taken in conjunction with the drawings.

DESCRIPTION OF THE DRAWINGS

FIG. 6 is a plan view of a third embodiment of the platform; and

FIG. 7 is sectional view taken along line VII—VII of FIG. 6.

DESCRIPTION OF THE PREFERRED EMBODIMENTS

Referring now to FIGS. 1–4, a platform for supporting a semiconductor substrate during thermal processing in a chemical vapor deposition reactor is generally indicated by the numeral 10. In the illustrated embodiment, platform 10 comprises a single wafer processing platform that is suitable for supporting a semiconductor substrate 12 during various fabrication processes, such as thermal annealing, thermal reflow of boro-phosphorous gases, and chemical vapor deposition of thin film applications, including high temperature oxide, low temperature oxide, high temperature nitride, doped and undoped polysilicon, silicon epitaxial and tungsten metal and tungsten silicide films, in the fabrication of semiconductor devices. As will be described in more detail, platform 10 comprises a composite platform which is especially suited for use in a chemical vapor deposition reactor, such as reactor 13 shown in FIGS. 3 and 4, which is described in more detail in co-pending application Ser. No. 08/911,638 entitled REACTOR AND METHOD OF PROCESSING A SEMICONDUCTOR SUBSTRATE filed on Aug. 15, 1997, by Imad Mahawili, now U.S. Pat. No. 5,814,365, which is incorporated by reference in its entirety herein. But it should be understood that platform 10 may be used in other processing reactors.

Figure 1:
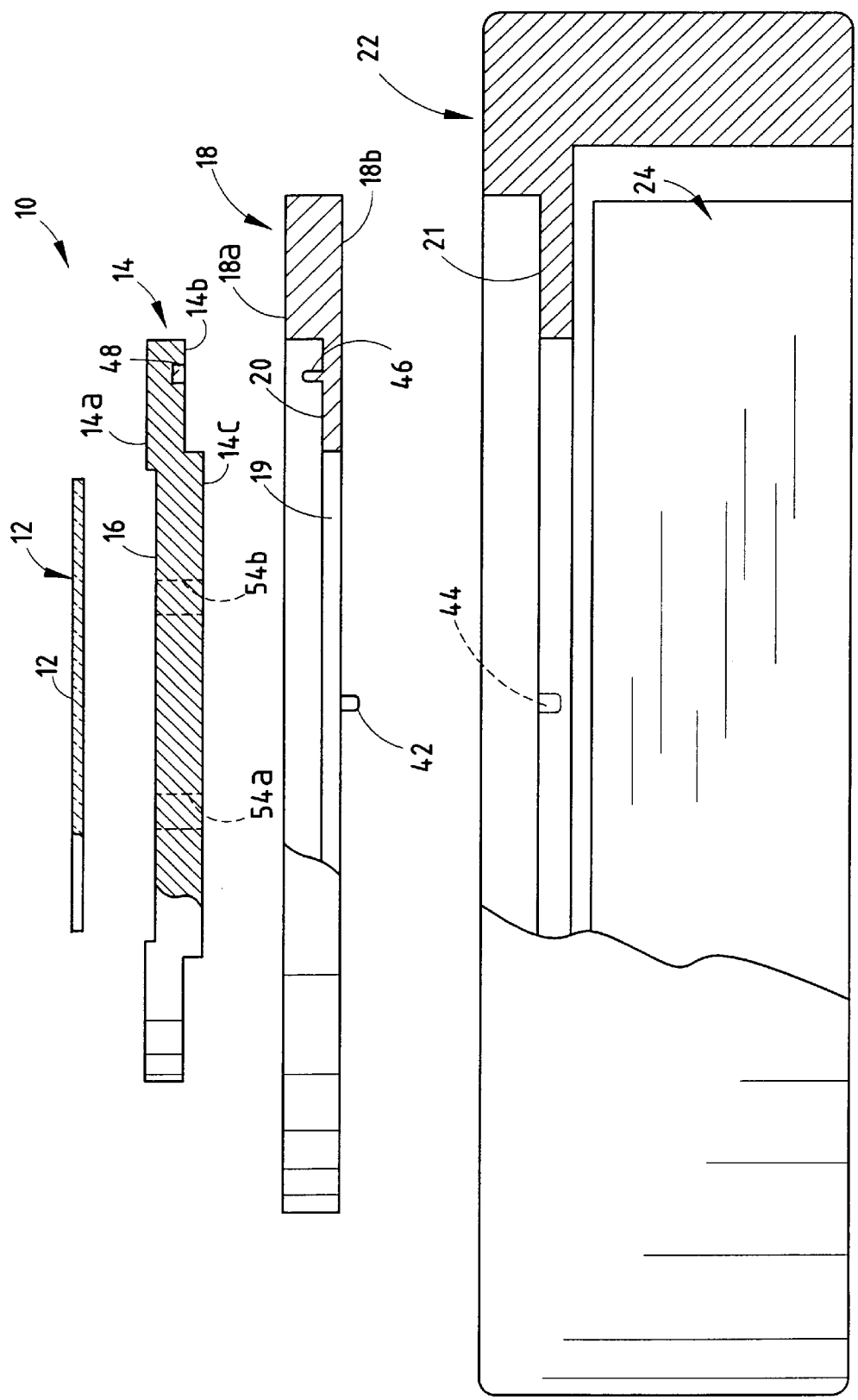
FIG. 1 is an exploded segmented cross-sectional view of the platform of the present invention.

Referring to FIG. 1, platform 10 includes a first member 14, which provides a generally planar support surface 16 for substrate 12. Support surface 16 is sized to permit unrestrained radial expansion of substrate 12 and, furthermore, is recessed to support substrate 12 substantially flush with an upper surface 14a of first member 14. Platform 10 also includes a second member 18, which provides a support surface 20 for first member 14. Support surface 20 is sized to permit radial expansion of first member 14 and recessed to support first member 14 and substrate 12 substantially flush with an upper surface 18a of second member 18. In this manner, processing gases may flow across substrate 12 unimpeded by an irregular surface topology created by the edges of substrate 12 or first member 14.

Figure 2:
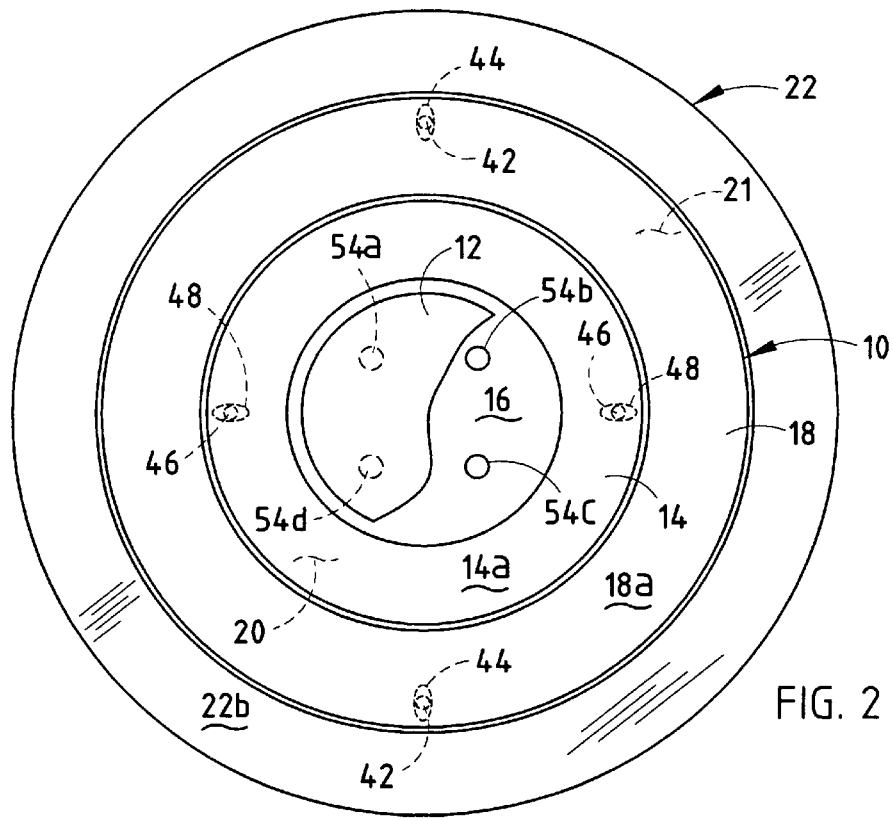
FIG. 2 is a segmented plan view of the platform with a semiconductor wafer supported thereon.
Figure 4:
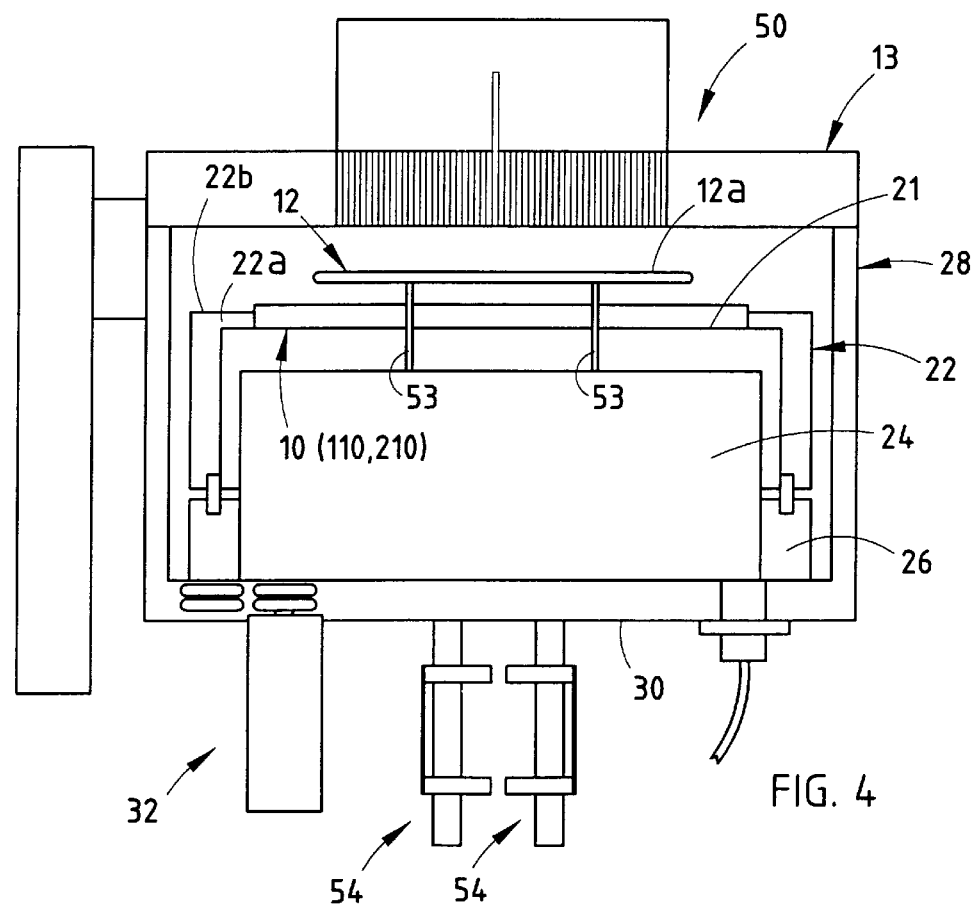
FIG. 4 is a schematic sectional view taken along line IV—IV of FIG. 3.

As best seen in FIGS. 2 and 4, platform 10 is supported in reactor 13 on an annular support surface 21 provided on a rotatable heater housing 22 which is enclosed and vacuum sealed in reactor housing 28 (FIG. 4). Heater housing 22 encloses a heater assembly 24 which provides heat to substrate 12 through platform 10 during processing. Heater assembly 24 is designed to deliver radiant heat to substrate 12 through platform 10 in a manner such that the temperature in the substrate is substantially uniform. In a preferred form, heater assembly 24 includes an array of heating elements such as linear tungsten-halogen lamps (not shown), which emit peak radiation at 0.95 microns and are layered to form a plurality of heating zones, which provide a concentrated heating profile with a greater amount of heat being applied to the outer perimeter of the substrate than the center of the substrate. For further details of heater assembly 24, reference is made to co-pending U.S. Patent application entitled RAPID THERMAL PROCESSING HEATER TECHNOLOGY AND METHOD OF USE, filed on Dec. 4, 1996, Ser. No. 08/759,559, which is incorporated herein by reference in its entirety. It should be understood that other heaters may be used to heat substrate 12; however, heater assembly 24 preferably delivers heat to substrate 12 in a substantially uniform manner.

Referring to FIG. 4, heater assembly 24 is enclosed and, preferably, sealed in heater housing 22, which is mounted on a rotatable base 26 of reactor housing 28. Heater housing 22 is made from a suitable material, such as a ceramic, graphite, or, more preferably, from silicon carbide coated graphite. Heater assembly 24, heater housing 22, and rotatable base 26 are enclosed and vacuum sealed in outer, reactor housing 28 and are supported on a base wall 30 of reactor housing 28.

Base 26 and housing 22 are rotatably supported on base wall 30 of housing 28 and are rotated, preferably, using a conventional magnetically coupled drive 32 or other suitable driving devices, which can impart rotation to base 26 through a vacuum seal.

As previously described, substrate 12 is supported in reactor housing 28 on platform 10. Platform 10 comprises a suitable material, such as quartz, pure silicon carbide, silicon carbide coated graphite, zirconia, alumina, aluminum, steel, or the like. For example, when processing a silicon wafer, platform 10 preferably comprises silicon carbide coated graphite. During processing, platform 10 is seated and supported in recessed annular support surface 21 provided in an upper wall 22a of heater housing 22. Annular recessed support surface 21 is sized to permit unrestrained radial thermal expansion of platform 10. Furthermore, the depth of recessed annular support surface 21 is sized so that semiconductor substrate 12, when seated in support surface 16 of platform 10, is substantially flush with the upper surface 22b of heater housing 22.

As described previously, support surface 16 of first member 14 is recessed and defines a first well 38. Well 38 is sized so that substrate 12 is substantially flush with upper surface 14a of first member 14. Preferably, the depth of well 38 is equal to the thickness of substrate 12 plus about twenty-thousandths of an inch. In a similar manner, support surface 20 defines a second well 40 with a depth, preferably, equal to the overall height or thickness of first member 14. Furthermore, recessed annular support surface 21 is preferably recessed in upper wall 22a of housing 22 a depth equal to the thickness or overall height of second member 18. By supporting substrate 12 substantially flush with the top surface of heater housing 22, platform 10 permits a positioning of substrate 12 on heater housing 22 to define a substantially flat surface wherein the raised edges of substrate 12 and platform 10 do not interfere with the gas flow across the wafer surface.

In order to rotatably couple platform 10 to housing 22, second member 18 includes at least one positioning member 42 (FIG. 1), such as a downwardly extending positioning pin which cooperates with a corresponding cooperating surface 44 (FIG. 1), such as a recess, including a groove or an aperture, provided in upper wall 22a of housing 22. Preferably, cooperating member 44 is an elongated or slotted recess to permit unrestricted or unrestrained relative radial thermal expansion of second member 18 and housing 22 during the thermal processing of substrate 12. In a similar manner, second member 18 is rotatably coupled to first member 14 by a positioning member 46 (FIG. 1), such as an upwardly extending positioning pin, which engages a cooperating surface 48, such as a recess, provided in first member 14. Preferably, cooperating surface 48 is a slotted or elongated recess to permit unrestricted or unrestrained relative radial thermal expansion between first member 14 and second member 18.

It should be understood from the foregoing that composite platform 10 provides a substantially planar stacking arrangement which permits unrestrained thermal expansion of the component parts of the platform and substrate 12 and permits the thickness of first member 14 to be minimized to increase the rate of heat transfer from the heater assembly 24 to substrate 12 during thermal processing. At the same time, second member 18 provides reinforcement to first member 14 without impeding the heat transfer rate from heater assembly 24 to substrate 12.

As best seen in FIG. 2, second member 18 preferably comprises a ring-shaped member with annular support surface 20 being defined radially inward of the outer perimeter of ring-shaped member. Referring to FIG. 1, ring-shaped second member 18 has a first cross-section at its outer perimeter and a second, reduced cross-section radially inward of its first cross-section, which defines recessed annular support surface 20. This may be achieved by grinding or machining of recessed annular support surface 20 or other fabrication or manufacturing techniques. First member 14 preferably comprises a disc insert having a substantially uniform thickness across the disc-shaped insert with recessed support surface 16 being defined by a centrally located offset portion of the disc-shaped insert. The offset portion of first member 14 is preferably formed by grinding or machining well 38 into the central portion of first member 14. Furthermore, in order to seat support surface 16 in the opening ring-shaped second member 18, a lower surface 14b of first member 14 is offset, preferably by grinding or machining. In this manner, when substrate 12 is placed in well 38 and first member 14 is inserted into well 40 of upper second member 18, the upper surface 18a of second member 18 will be substantially flush with upper surface 14a of first member 14 which will be substantially flush with the top surface 12a of substrate 12. Likewise, the lower most surface 14c of first member 14 will be substantially flush with lower surface 18b of second member 18.

By constructing platform 10 from a relatively thin, first member (14), on the order of 0.04" thick, and a thicker second member (18), for example on the order of 0.10 to 0.25 inches thick which reinforces and supports first member 14, platform 10 can accommodate a wide range of substrate sizes. For example, platform 10 can support substrates having diameters of 150, 200, and 300 mm or more. Platform 10 permits the thickness of the member in contact with substrate 12 to be minimized and yet provides sufficient structural integrity to withstand the rapid heat up rates associated with the thermal processing of semiconductor substrates.

Figure 3:
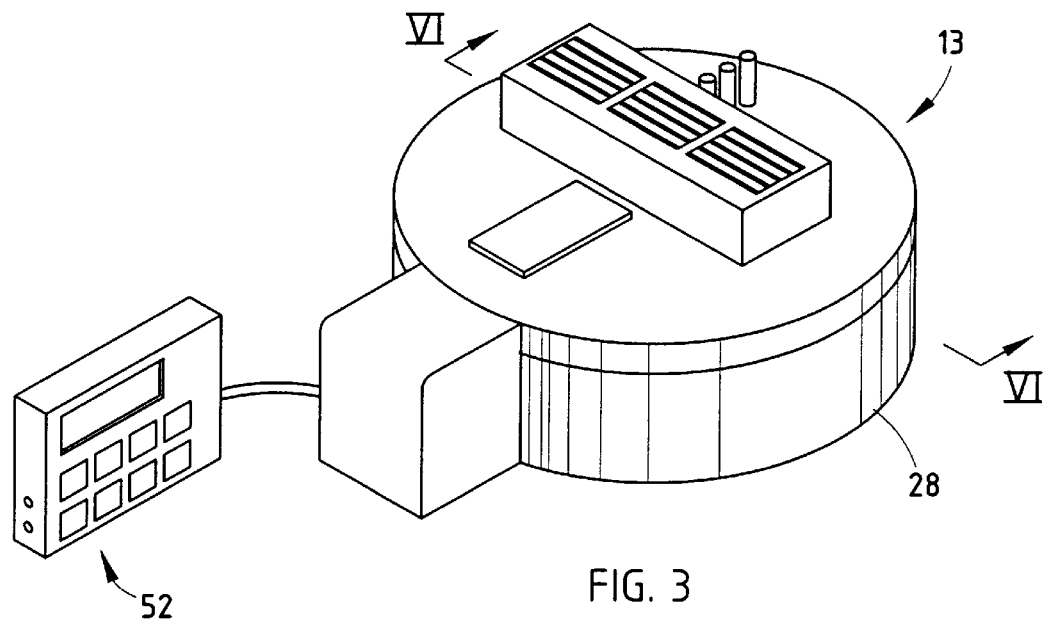
FIG. 3 is a perspective view of a suitable chemical vapor deposition reactor employing the platform of FIG. 1.

Referring to FIGS. 3 and 4, reactor 13 includes a gas injection manifold 50 which injects one or more gases onto a localized or discrete region of the substrate surface wherein thin film deposition takes place. Reactor 13 further includes an emissivity measurement system 52 for measuring the emissivity and calculating the temperature of substrate 12 during the various fabrication processes in order to control the processes. For further details of a suitable gas injection manifold and emissivity measurement system, reference is made to co-pending patent application entitled REACTOR AND METHOD OF PROCESSING A SEMICONDUCTOR SUBSTRATE filed on Aug. 15, 1997, by Imad Mahawili.

After semiconductor substrate 12 has been processed, substrate 12 is raised off platform 10 by a plurality of lifter pins 53 which protrude through and lift substrate 12 off platform 10 for automatic loading and unloading of substrate 12 within reactor 13. Lifter pins 53 are raised and lowered by magnetically coupled wafer lifters 54, which are conventionally known in the art. Pins 53 are centrally located in housing 22 and project through a central portion of the heater assembly 24 and through a central portion of platform 10. In preferred form, at least three lifter pins 53 are provided. In the most preferred form, four lifter pins 53 are provided, and first member 14 includes a corresponding number of openings 54a, 54b, 54c, and 54d to enable lifter pins 53 to protrude through first member 14 and lift substrate 12 off platform 10 for automatic loading and unloading of substrate 12. It can be appreciated that lifter pins 53 can only be operated when housing 22 and platform 10 are positioned so that openings 54a, 54b, 54c, and 54d in first member 14 are aligned with lifter pins 53, for example in a "HOME" position. Therefore, positioning members 42 and 46 and cooperating surfaces 44 and 48 are aligned so that when platform 10 is positioned on heater housing 22, openings 54a, 54b, 54c, and 54d will be properly aligned to allow lifter pins 53 to extend through first member 14 to lift substrate 12 of platform 10 after processing.

Figure 5:
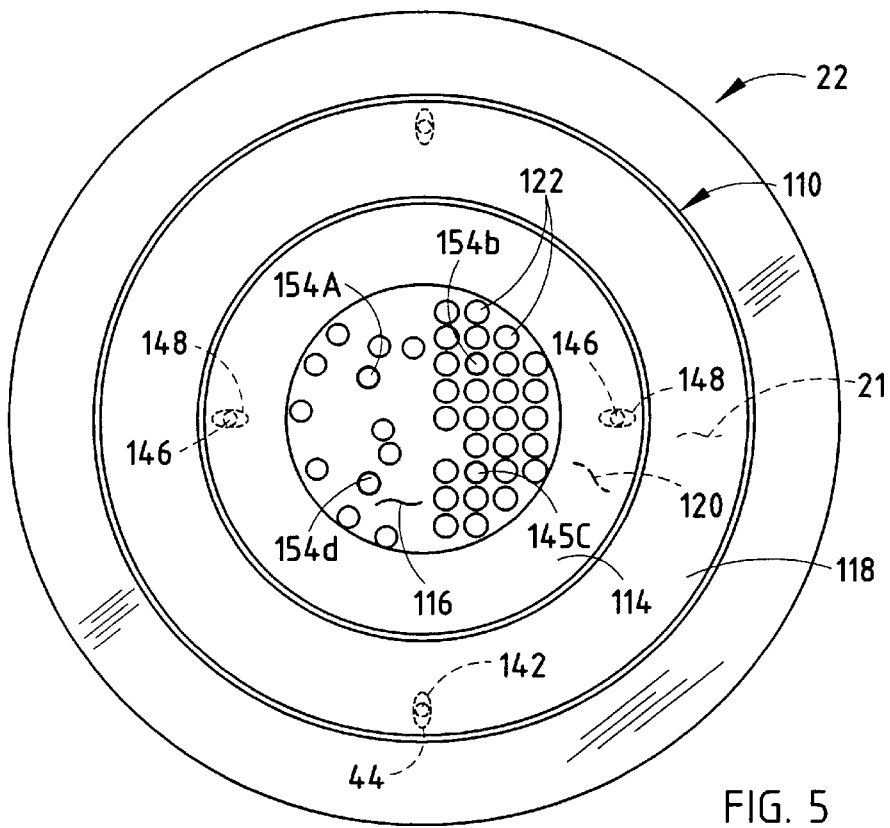
FIG. 5 is a plan view of a second embodiment of the platform.

Referring to FIG. 5, a second embodiment of a platform 110 is illustrated. Platform 110 includes a first member 114 with a first support surface 116, and a second member 118 with a second support surface 120. Similar to the previous embodiment, platform 110 is supported on a recessed annular support surface 21 of heater housing 22. Furthermore, second member 118 includes at least one positioning member 142 such as a downwardly extending positioning pin, which extends into a cooperating surface 44, preferably an elongated or slotted recess, of recessed annular support surface 21 of housing 22. In this manner, second member 118 is rotatably coupled with housing 22 and yet is unrestrained in the radial direction to permit radial thermal expansion of 118 during the thermal processing of substrate 12. Similarly, second member 118 includes at least one second positioning member 146, such as an upwardly extending position pin, which extends into a cooperating surface 148, such as an elongated or slotted or recess, which rotatably couples second member 118 with first member 114.

As best seen in FIG. 5, support surface 116 of first member may include a plurality of transverse holes or apertures 122 in addition to lift openings 154a, 154b, 154c, and 154d, which permit unimpeded heat transfer from heater assembly 24 to substrate 12 during the thermal processing of substrate 12. Apertures 122 may be provided in a uniform pattern or may be provided in a non-uniform pattern, for example, with more apertures provided at the perimeter than at the central portion of support surface 116. Furthermore, apertures 122 permit cooling of substrate 12 after the thermal processing of substrate 12. Moreover, inert gases, such as nitrogen, argon, or helium, may be injected into heater housing 22 and directed to substrate 12 through apertures 122 in platform 10 to cool substrate 12. Although apertures 122 may permit transmission of photon energy from heater assembly 24 into the processing chamber of reactor 13 when semiconductor wafer 12 becomes opaque during heating, substrate 12 is opaque only for a discrete range of temperatures and remains opaque for a short duration. Furthermore, by including apertures 122, the heat up rate of substrate 12 is increased by locally eliminating a portion of platform 110. Moreover, apertures 122 may provide a substrate wafer backside showerhead gas injection system for cooling the wafer after processing with a suitable inert gas.

Referring to FIG. 6, a third embodiment of a platform 210 is illustrated. Similar to the previous embodiments, platform 210 includes a first member 214 for supporting substrate 12 and a second member 218 for supporting first member 214 and substrate 12 on housing 22. In order to reduce the hoop stresses in first member 214 due to the rapid heating process, first member 214 includes a transverse slot or splice 211, which extends radially outward from a central portion of support surface 216 to the free edge 214c of first member 214. Preferably, transverse slot or splice 211 extends from one of the substrate lifter holes 254a, 254b, 254c, or 254d to outer free edge 214c of first member 214.

As best seen in FIG. 7, slot 211 is preferably angled with respect to the support surface 216 of first member 214 so that leakage of light from heating assembly 24 into the processing chamber of reactor 13 is minimized. Furthermore, gas penetration from the processing chamber into the lamp area of heater housing 22 is minimized. Preferably, slot 211 forms acute angle "A" between support surface 216 of first member 214 and the longitudinal axis 211a of slot 211. More preferably, slot 211 forms angle "A" in a range of about ten to thirty degrees. Most preferably, angle "A" is about twenty degrees.

Figure 8:
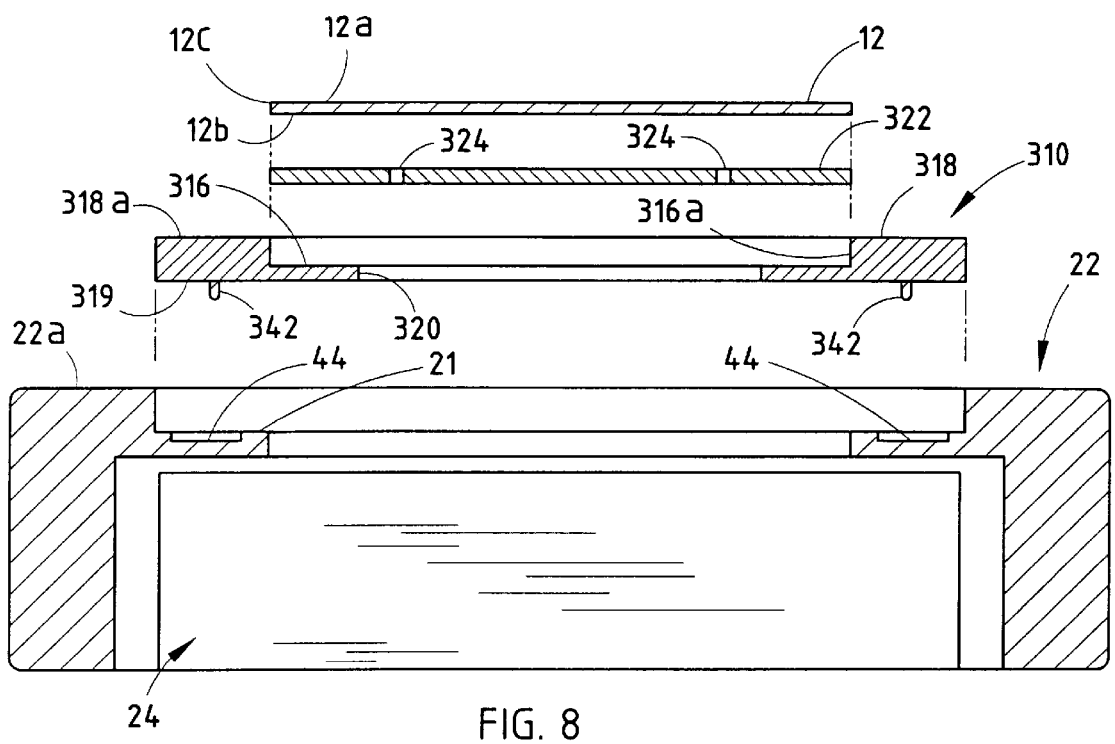
FIG. 8 is an exploded segmented cross-sectional view of a fourth embodiment of the platform.
Figure 9:
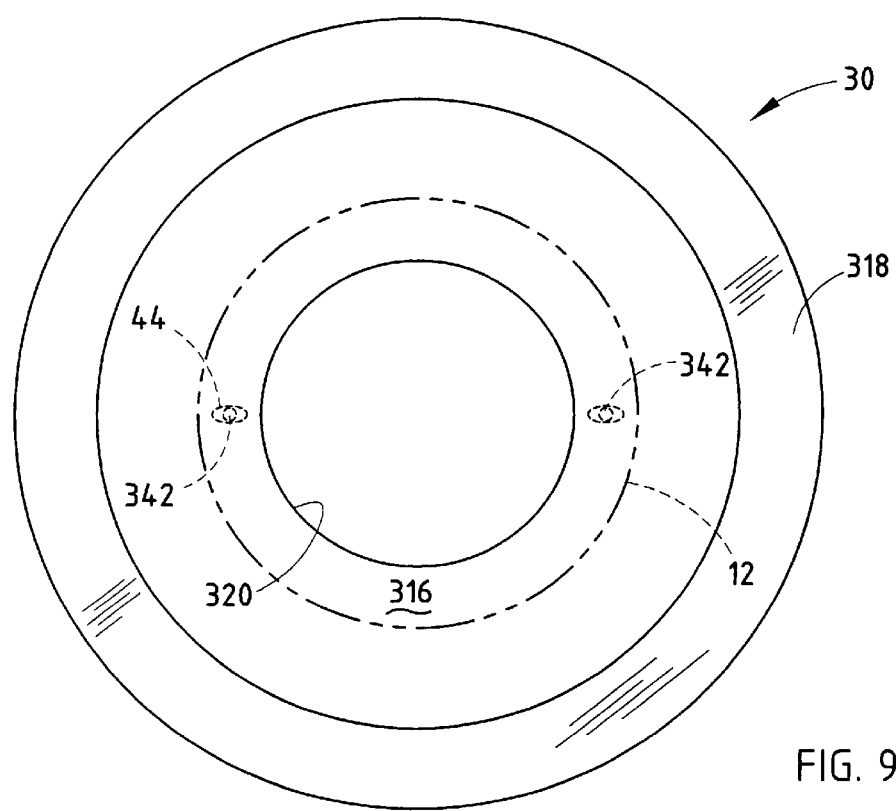
FIG. 9 is a top plan view of the platform in FIG. 8.

Referring to FIGS. 8 and 9, a further embodiment of platform 310 is illustrated. Platform 310 comprises a generally disc-shaped annular member or base 318 which includes an annular substrate support surface 316 on one side of member 318 and a mounting or platform support surface 319 on an opposed side of member 318. Platform 310 is preferably constructed from silicon carbide coated graphite, or other suitable materials. Reference is made to the first embodiment of platform 10, for other examples of suitable materials. Substrate support surface 316 is sized to support substrate 12 in a radially unrestrained manner. Preferably, substrate support surface 316 is sized to leave a gap, for example a gap of about 0.025 inches between the peripheral wall 316a surrounding recessed surface 316 and the perimeter 12c of substrate 12. In this way, when substrate 12 is subject to high temperatures, during processing, substrate 12 is radially unrestrained by platform 310 and is, therefore, free to undergo unrestrained thermal expansion.

Substrate support surface 316 is defined by a stepped or recessed annular surface which is preferably centrally located on annular base 318 and which defines a central opening 320. The size of central opening 320 can be varied and is primarily a function of the size of substrate 12. Generally, the larger the substrate, the larger the central opening 320 may be. However, as central opening 320 is increased, central opening 320 encroaches on the width of support surface 316. Therefore, the size of central opening 320 is limited by a minimum support surface width, for example 0.050 inches. Central opening 320 permits a large section or portion of the non-device side 12b of substrate 12 to be directly exposed to the heat flux from heater assembly 24. This results in a substantially unimpeded heating of substrate 12 by heater assembly 24. Although, central opening 320 also may permit the transmission of photon energy from heater assembly 24 into the processing chamber of reactor 13 when substrate 12 becomes opaque during heating, substrate 12 is opaque only over a discrete range of temperatures. These temperatures are typically below the normal processing temperature of substrate 12; therefore, substrate 12 is opaque for a short duration only either during the ramp-up stages, when heater assembly 24 increases the heat flux to the processing temperature or during the ramp-down stages when heater assembly 24 is turned off and cools down.

It can be appreciated that by eliminating the central portion of platform 310, the heat-up rate of substrate 12 is substantially increased. In addition, central opening 320 permits lifter pins (not shown in this embodiment) to raise substrate 12 off platform 310 after processing. Reference is made to the first embodiment of the platform for further details of the lifter pins and reactor 13. Similar to the apertures 122 of the second embodiment, central opening 320 may also be subsequently used to provide access to substrate 12 for cooling the substrate after processing. In other words, both sides 12a and 12b of substrate 12 are accessible and exposed for cooling, but only the device side 12a is exposed to the reactor gases when the substrate is placed in the processing chamber.

As best seen in FIG. 8, annular base 318 also includes at least two couplers, such as projecting positioning members 342, which releasably secure annular base 318 to second housing 22. Similarly to the previous embodiments, when platform 310 is supported on second housing 22, positioning members 342 seat in corresponding couplers, such as receiving structures or recesses 44, preferably slotted apertures or grooves, provided in platform support surface 21. In this manner, platform 310 is rotatably coupled to housing 22 and yet is radially unrestrained. It should be understood that support surface 21 may include projecting positioning members, and platform 310 may include corresponding receiving structures.

Again, similar to the previous embodiments, platform 310 provides a stacking arrangement whereby each of the component parts, in this particular embodiment, annular base 320 and substrate 12, are thermally unrestrained. This is achieved by oversizing the recessed substrate surface and by over sizing the platform support surface 21 of housing 22 as will be more fully described below.

In addition, recessed annular support surface 316 is preferably recessed to a depth at least equal to the thickness of the substrate so that substrate 12, when seated on support surface 316, is substantially flush with a top surface 318a of annular base 318. For example, for a platform having 0.25 inch thickness, support surface 316 is preferably recessed in a range of about ⅛ to about 3/16 inch, which leaves ⅛ inch to 1/16 inch thickness of the platform for supporting substrate 12 thereon. As described in reference to the earlier embodiments, support surface 21 of housing 22 is similarly recessed at least equal to the thickness of platform 310. In this manner, when substrate 12 is seated on platform 310 and platform 310 is seated on support surface 21 of housing 22, both substrate 12 and platform 310 are substantially flush with a top surface 22a of housing 22.

Again, referring to FIG. 8, platform 310 may also include a disc insert 322, which covers central opening 320 and provides a gas barrier for substrate 12. Preferably, disc insert 32 comprises a quartz material and includes at least three and, preferably, four lifter pin holes 324 to allow the lifter pins (shown in previous embodiments) to extend through disc 322 to lift substrate 12 from platform 310. Where platform 310 includes disc 322, substrate support surface 316 is recessed further by the thickness of disc 322 to maintain the position of substrate 12 substantially flush with upper surface 318a of platform 310.

For the purposes of the preceding description, the terms "upper" or "lower" and derivatives or equivalents thereof shall relate to the invention as oriented in FIGS. 1, 3, 4, 7, and 8. It is understood that the invention may assume various alternative orientations, except where expressly specified to the contrary. It is also understood that the specific devices and methods illustrated in the attached drawings, and described in the preceding specification, are simply exemplary embodiments of the inventive concepts defined in the appended claims. Hence, specific dimensions and other physical characteristics relating to the embodiments disclosed herein are not to be considered limiting unless the claims expressly state otherwise.

While several forms of the invention have been shown and described, other forms will now be apparent to those skilled in the art. For example, the thickness of the platform members may be varied and the number of cooperating members and engagement surfaces may be increased. Moreover, the form of the cooperating members and engagement surfaces may be varied as would be understood by those persons having ordinary skill in the art. In addition, platforms 10, 110, 210, and 310 may be used in other reactors with other lifting mechanisms, heating systems, and/or gas injection systems. Therefore, it will be understood that the embodiments shown in the drawings and described above are merely for illustrative purposes, and are not intended to limit the scope of the invention which is defined by the claims which follow.

I claim:

1. A platform for supporting a semiconductor substrate during processing in a processing chamber, the processing chamber having a rotatable housing, said platform comprising:
    an annular member having a central opening, a first side with a generally planar recessed surface, and a second side configured for being supported by the rotatable housing, said recessed surface configured to support the substrate thereon and to permit unrestrained thermal expansion of the substrate; and
    a coupler positioned on said second side of said annular member, said coupler for rotatably coupling said annular member to the rotatable housing and being configured to permit unrestrained thermal expansion of said annular member during processing.

2. The platform according to claim 1, wherein said support surface comprises an annular support surface.

3. The platform according to claim 1, wherein said annular member includes central recessed portion, said central recessed portion including said central opening, and said central recessed portion defining said generally planar recessed surface.

4. The platform according to claim 1, wherein said coupler comprises a projecting member configured to extend into a corresponding receiving structure provided on the rotatable housing for rotatably coupling said annular member to the rotatable housing.

5. The platform according to claim 1, wherein said coupler comprises a recessed structure configured to receive a corresponding coupler of the rotatable housing for rotatably coupling said annular member to the rotatable housing.

6. The platform according to claim 1, wherein said recessed surface is sized to permit unrestrained radial thermal expansion of the substrate during thermal processing.

7. The platform according to claim 1, wherein said annular member comprises a generally disc-shaped member, said disc-shaped member having a recessed central portion, said recessed central portion defining said recessed surface.

8. The platform according to claim 1, wherein said recessed surface comprises an annular recessed surface, said annular recessed surface extending around said central opening.

9. The platform according to claim 1, wherein said annular member includes an upper surface, said recessed surface being adapted to support the substrate substantially flush with said upper surface of said annular member.

10. The platform according to claim 1, wherein said annular member comprises a material selected from the group comprising quartz, silicon carbide, zirconia, alumina, aluminum, steel, and silicon carbide coated graphite.

11. The platform according to claim 1, further comprising an insert, said insert being supported on said generally planar recessed surface for covering said central opening and providing a gas barrier.

12. The platform according to claim 11, wherein said insert comprises a disc.

13. The platform according to claim 11, wherein said insert comprises quartz.

14. A reactor for processing a substrate, said reactor comprising:
- a reactor housing defining a processing chamber;
- a platform having an annular body defining a central opening, said annular body having opposed sides, one of said opposed sides including a recessed substrate support surface adapted to support the substrate thereon, the other of said sides being rotatably supported in said housing;
- a heater adapted to heat the substrate, said heater being supported in said housing; and
- at least one gas injector adapted to inject at least one processing gas into said processing chamber for deposition onto the substrate.

15. The reactor according to claim 14, further comprising a heater housing, said heater housing including a recessed platform support surface, said recessed platform support surface supporting said platform thereon.

16. The reactor according to claim 14, wherein said recessed substrate support surface is sized to support the substrate substantially flush with an upper surface of said one side of said platform.

17. The reactor according to claim 14, wherein said platform is rotatably coupled to said heater housing whereby said platform and said heater housing rotate together.

18. The reactor according to claim 17, wherein said platform includes means for rotatably securing to said heater housing while permitting unrestrained thermal growth of said platform.

19. The reactor according to claim 18, wherein said means for securing comprises a coupler, said coupler cooperating with said recessed platform support surface to rotatably support said platform thereon.

20. The reactor according to claim 19, wherein said heater housing includes a cooperating recess receiving said coupler to thereby releasably secure said platform to said heater housing, said recess being slotted to permit unrestrained thermal expansion of said platform.

21. A method of supporting a substrate during processing, the substrate including a non-device side and a device side, said method comprising the steps of:
- providing a processing chamber having a heater and a platform support surface;
- providing a removable platform having a recessed substrate support surface and a central opening;
- supporting the non-device side of the substrate on the recessed substrate support surface of the removable platform;
- supporting the removable platform on the platform support surface in the processing chamber over the heater to permit the thermal flux of the heater to directly impinge on the non-device side of the substrate through the central opening of the platform; and
- adapting the platform support surface of the processing chamber and the substrate support surface of the removable platform to permit unrestrained relative radial thermal expansion of the platform and the substrate, respectively, during thermal processing of the substrate.

22. A method according to claim 21, further comprising recessing the substrate support surface whereby the device side of the substrate is substantially flush with an upper surface of the removable platform.

23. A method according to claim 22, further comprising:
- providing a rotatable housing in the processing chamber, the rotatable housing including the platform support surface; and
- adapting the platform support surface to support the platform substantially flush with an upper surface of the rotatable housing.

24. A method according to claim 21, further comprising covering the central opening with a gas barrier.

* * * * *